(12) United States Patent
Yamaoka et al.

(10) Patent No.: US 7,957,193 B2
(45) Date of Patent: Jun. 7, 2011

(54) SEMICONDUCTOR MEMORY DEVICE INCLUDING TWO DIFFERENT NONVOLATILE MEMORIES

(75) Inventors: Kunisato Yamaoka, Osaka (JP); Kazuyo Nishikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 153 days.

(21) Appl. No.: 12/393,755

(22) Filed: Feb. 26, 2009

(65) Prior Publication Data

US 2009/0296479 A1 Dec. 3, 2009

(30) Foreign Application Priority Data

May 30, 2008 (JP) .................................. 2008-142897

(51) Int. Cl.
*G11C 16/04* (2006.01)
(52) U.S. Cl. .................................. 365/185.18; 365/145
(58) Field of Classification Search ......... 365/185.18 O, 365/145 X, 185.18, 145
See application file for complete search history.

(56) References Cited

U.S. PATENT DOCUMENTS

| 5,847,997 | A | * | 12/1998 | Harada et al. ............. 365/185.33 |
| 7,397,686 | B2 | | 7/2008 | Takashima et al. |
| 7,773,433 | B2 | * | 8/2010 | Garnier ...................... 365/189.2 |
| 7,778,078 | B2 | * | 8/2010 | Nagadomi et al. ........ 365/185.09 |
| 2006/0087893 | A1 | * | 4/2006 | Nishihara et al. ......... 365/189.01 |
| 2008/0084782 | A1 | * | 4/2008 | Fukada ......................... 365/239 |

FOREIGN PATENT DOCUMENTS

JP 07-281842 10/1995
JP 2004-341989 12/2004

* cited by examiner

*Primary Examiner* — VanThu Nguyen
(74) *Attorney, Agent, or Firm* — McDermott Will & Emery LLP

(57) ABSTRACT

There are provided a first nonvolatile memory array including a plurality of nonvolatile memory elements which require an erase operation before a write operation, and a second nonvolatile memory array including a plurality of overwritable nonvolatile memory elements. A request to rewrite data is received by a control circuit. The control circuit writes data to be rewritten to the second nonvolatile memory array when the capacity of the data to be rewritten is not more than that of the second nonvolatile memory array.

7 Claims, 8 Drawing Sheets

SEMICONDUCTOR MEMORY DEVICE INCLUDING TWO DIFFERENT NONVOLATILE MEMORIES

CROSS REFERENCE TO RELATED APPLICATION

This Non-Provisional application claims priority under 35 U.S.C. §119(a) on Patent Application JP 2008-142897, filed May 30, 2008, which are entirely incorporated herein by reference, inclusive of the specification, drawings, and claims.

BACKGROUND

The present specification discloses a semiconductor memory device including a nonvolatile memory.

There is a prevalence of various small-sized and high-performance electronic equipment having a memory function, such as mobile terminal equipment and an IC card. With the prevalence, demand is rising for a semiconductor memory device capable of low-voltage and high-speed operation with low power consumption, suitably for such electronic equipment. The demand is particularly high for a nonvolatile memory. Typical representatives of the nonvolatile memory include a flash memory and a ferroelectric memory. The flash memory has the advantage that it allows a reduction in memory cell area, and can be formed as a small chip. However, the flash memory has the disadvantage that the number of rewrite cycles is smaller than that of a magnetic disc or the like.

The ferroelectric memory also has the advantageous properties of low power consumption and high-speed operation. Thus, each of the flash memory and the ferroelectric memory has the advantage of its own so that a technology for forming a semiconductor memory device from the flash memory and the ferroelectric memory will attract more attention in future.

For example, there is a technology which uses the ferroelectric memory as a substitute memory means for the flash memory depending on the frequency of rewrite operations to the flash memory for the purpose of compensating for the disadvantage of the flash memory, while taking the advantage thereof (see, e.g., Japanese Laid-Open Patent Publication No. HEI 7-281842). The technology allows a solution to the problem associated with the limited number of rewrite cycles of the flash memory.

SUMMARY

In addition to the limited number of rewrite cycles, the flash memory also has the disadvantage of a long erase time and a long rewrite time. For example, even when small-scale data is to be rewritten, it is necessary in the flash memory to erase data in units of a predetermined block (expressed also as "in units of an array"), and then rewrite new data. Therefore, it may be considered that using the flash memory as a substitute for an EEPROM in rewriting small-scale data is disadvantageous.

As a solution to this problem, it can be considered to, e.g., provide a plurality of memory arrays, retrieve an unwritten array (region), and perform sequential writing to the unwritten region. This allows high-speed rewriting without the need to erase data as long as the unwritten region exists.

However, when the plurality of flash memory arrays are thus provided, the problem of an increased chip size occurs.

In view of the problems mentioned above, an object of the present invention disclosed hereinbelow is to achieve higher-speed rewriting of small-scale data, while suppressing an increase in chip size.

To solve the problem, an embodiment of the present invention is a semiconductor memory device including: a nonvolatile memory; a first nonvolatile memory array including a plurality of nonvolatile memory elements which require an erase operation before a write operation; a second nonvolatile memory array including a plurality of overwritable nonvolatile memory elements; and a control circuit configured to receive a request to rewrite data to write data to be rewritten to the second nonvolatile memory array when a capacity of the data to be rewritten is equal to or less than a capacity of the second nonvolatile memory array.

With the arrangement, access is made to the rewritable second nonvolatile memory array when data with a capacity of not more than that of the second nonvolatile memory array is to be rewritten. This allows rewriting of data without performing an erase operation in advance when data with a capacity of not more than that of the second nonvolatile memory array is to be rewritten. When rewriting of data is thus allowed without performing the erase operation in advance, it becomes possible to reduce the number of nonvolatile memory arrays compared with the case where a semiconductor memory device is formed from only nonvolatile memory arrays each of which requires an erase operation prior to a write operation. That is, it becomes possible to reduce a chip size.

DETAILED DESCRIPTION

Figure 1:
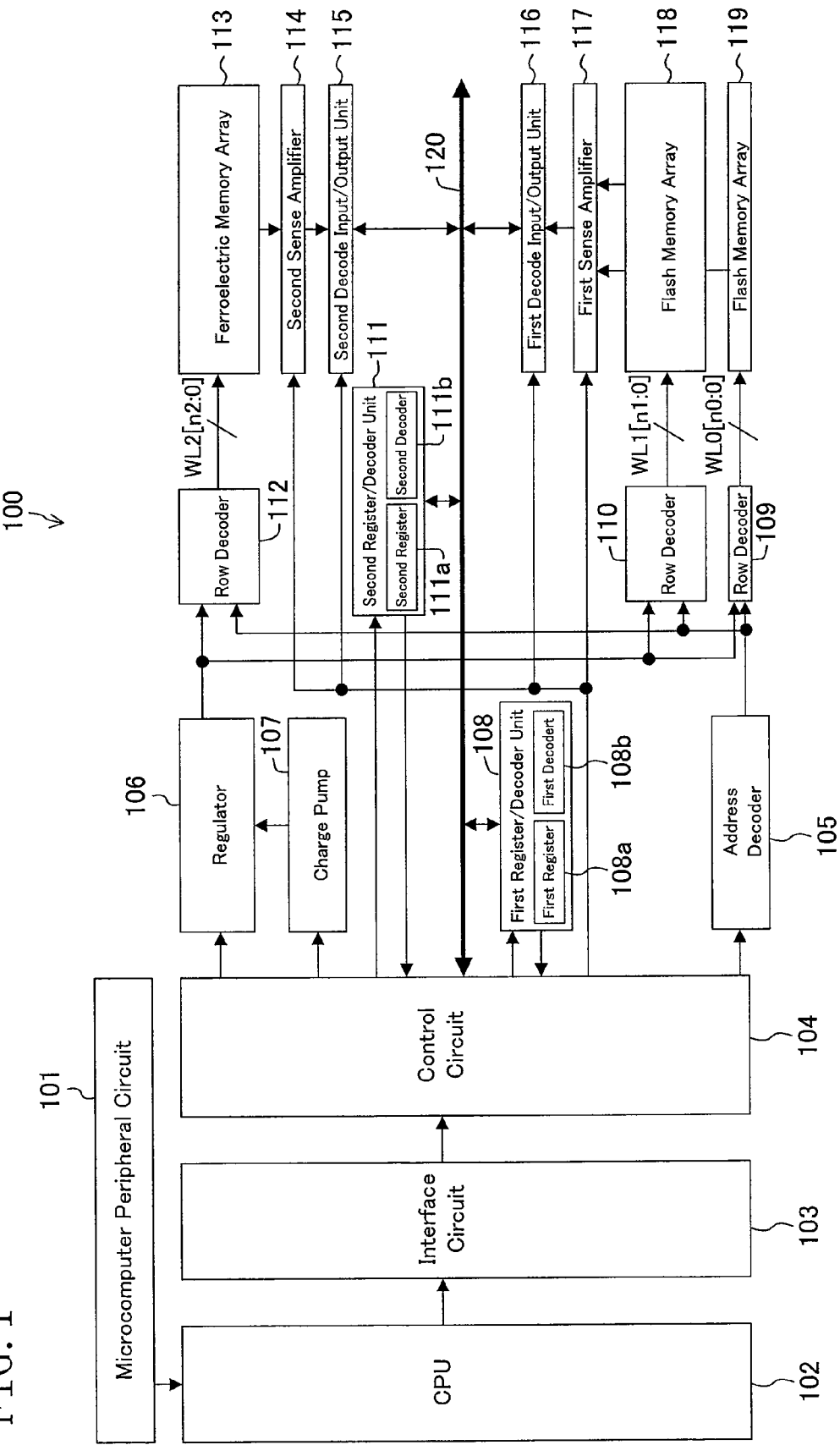
FIG. 1 is a block diagram showing a structure of a semiconductor memory device 100 according to Embodiment 1 of the present invention.

Referring to the drawings, the embodiments of the present invention will be described hereinbelow. The following embodiments are merely preferred examples, and are not intended to limit the present invention, the applications thereof, or the range of use thereof.

Embodiment 1

Overview

FIG. 1 is a block diagram showing a structure of a semiconductor memory device 100 according to Embodiment 1 of the present invention. The semiconductor memory device 100 is connected to a CPU (Central Processing Unit) 102.

The CPU 102 performs various processes using data stored in a nonvolatile memory (a flash memory array or a ferroelectric memory array which will be described later). In this example, the CPU 102 may request the nonvolatile memory to rewrite relatively small-scale data. The CPU 102 is connected to a microcomputer peripheral circuit 101. The microcomputer peripheral circuit 101 performs processing of data (such as data read from the nonvolatile memory), reception of data from the outside, outputting of data to the outside, and the like under the control of the CPU 102.

—Structure of Semiconductor Memory Device 100—

The semiconductor memory device 100 shown in FIG. 1 includes an interface circuit 103, a control circuit 104, an address decoder 105, a charge pump 107, a regulator 106, flash memory arrays 118 and 119, a first register/decoder unit 108, row decoders 109 and 110, a first sense amplifier 117, a first decode input/output unit 116, a ferroelectric memory array 113, a second register/decoder unit 111, and a second decode input/output unit 115. In the present embodiment, these components are formed on the same chip. As for the microcomputer peripheral circuit 101 and the CPU 102, they may be either formed on the same chip as that of the semiconductor memory device 100, or formed on another chip.

The interface circuit 103 facilitates data transfer between the CPU 102 and the control circuit 104. It is assumed herein that data also includes an instruction to the control circuit 104 or the like.

The control circuit 104 controls data writing or reading to the flash memory array 118 or 119, or to the ferroelectric memory array 113 in response to a request from the CPU 102. More specifically, the control circuit 104 performs outputting of a row address signal and a column address signal and transmission of a read command and a write command to the flash memory arrays 118 and 119 and the ferroelectric memory array 113, control of a voltage applied to a word line, and the like.

The address decoder 105 decodes a row address signal outputted from the control circuit 104, and outputs the decoded row address signal to the row decoders 109 and 110, and a row decoder 112.

The charge pump 107 increases a power supply voltage under the control of the control circuit 104, and outputs the increased power supply voltage to the regulator 106.

The regulator 106 controls the output of the charge pump 107 to a constant voltage, and outputs the output to the row decoders 109, 110, and 112. That is, in the present embodiment, the regulator 106 is shared between the flash memory arrays 118 and 119 and the ferroelectric memory array 113.

Each of the flash memory arrays 118 and 119 includes a plurality of nonvolatile memory elements which require an erase operation before a write operation. In the present embodiment, each of the flash memory arrays 118 and 119 uses flash memory elements as the nonvolatile memory elements.

The first register/decoder unit 108 is for storing data read from the flash memory arrays 118 and 119. The first register/decoder unit 108 decodes various commands for a write operation, a read operation, an erase operation, and the like to the flash memory arrays 118 and 119.

The row decoder 109 selects a word line in the flash memory array 119 in response to an output of the address decoder 105, and applies the voltage outputted from the regulator 106 to the selected word line. Likewise, the row decoder 110 selects any word line in the flash memory array 118, and applies the voltage outputted from the regulator 106 to the selected word line.

The first sense amplifier 117 amplifies outputs of the flash memory arrays 118 and 119, and outputs the amplified outputs to a data bus 120.

The first decode input/output unit 116 includes a column decoder (not shown) which decodes a column address outputted from the control circuit 104, and an input/output unit (not shown) which effects outputting of the output of the first sense amplifier 117 to the data bus 120, and data reception from the data bus 120.

The ferroelectric memory array 113 includes a plurality of overwritable nonvolatile memory elements. The ferroelectric memory array 113 according to the present embodiment uses ferroelectric memory elements which utilize the polarization inversion of a ferroelectric material as the nonvolatile memory elements.

The second register/decoder unit 111 is for storing data read from the ferroelectric memory array 113. The second register decoder unit 111 also decodes various commands for a write operation, a read operation, an erase operation, and the like to the ferroelectric memory array 113.

The row decoder 112 selects a word line in the ferroelectric memory array 113 in response to the output of the address decoder 105, and applies a voltage outputted from the regulator 106 to the selected word line.

A second sense amplifier 114 amplifies an output of the ferroelectric memory array 113, and outputs the amplified output to the data bus 120.

The second decode input/output unit 115 includes a column decoder (not shown) which decodes a column address outputted from the control circuit 104, and an input/output unit (not shown) which effects outputting of the output of the second sense amplifier 114 to the data bus 120, and data reception from the data bus 120.

—Operation of Semiconductor Memory Device 100—

For example, when the CPU 102 requests the semiconductor memory device 100 to rewrite data, and when the capacity of data to be rewritten is smaller than that of the ferroelectric memory array 113, the control circuit 104 outputs a row address signal and a column address signal each for selecting a predetermined address in the ferroelectric memory array 113, data to be newly written, and a command for a write operation. As a result, data whose rewriting has been requested by the CPU 102 is written to the ferroelectric memory array 113.

When a request to rewrite large-scale data (data of a scale larger than the capacity of the ferroelectric memory array 113) is issued from the CPU 102, the control circuit 104 first searches for an array subjected to an erase operation from between the flash memory arrays 118 and 119, and performs a write operation to the array subjected to an erase operation when it is found. When the array subjected to an erase operation is not found, the control circuit 104 performs an erase operation to either of the flash memory arrays 118 and 119, and then performs a write operation.

Thus, according to the present embodiment, the ferroelectric memory is accessed when small-scale data is to be rewritten. As a result, it becomes unnecessary to perform an erase operation with respect to the flash memory in advance. This allows a reduction in the number of flash memory arrays required in implementing an EEPROM-substituting function which rewrites small-scale data, and consequently allows a reduction in chip size.

Variation of Embodiment 1

Figure 2:
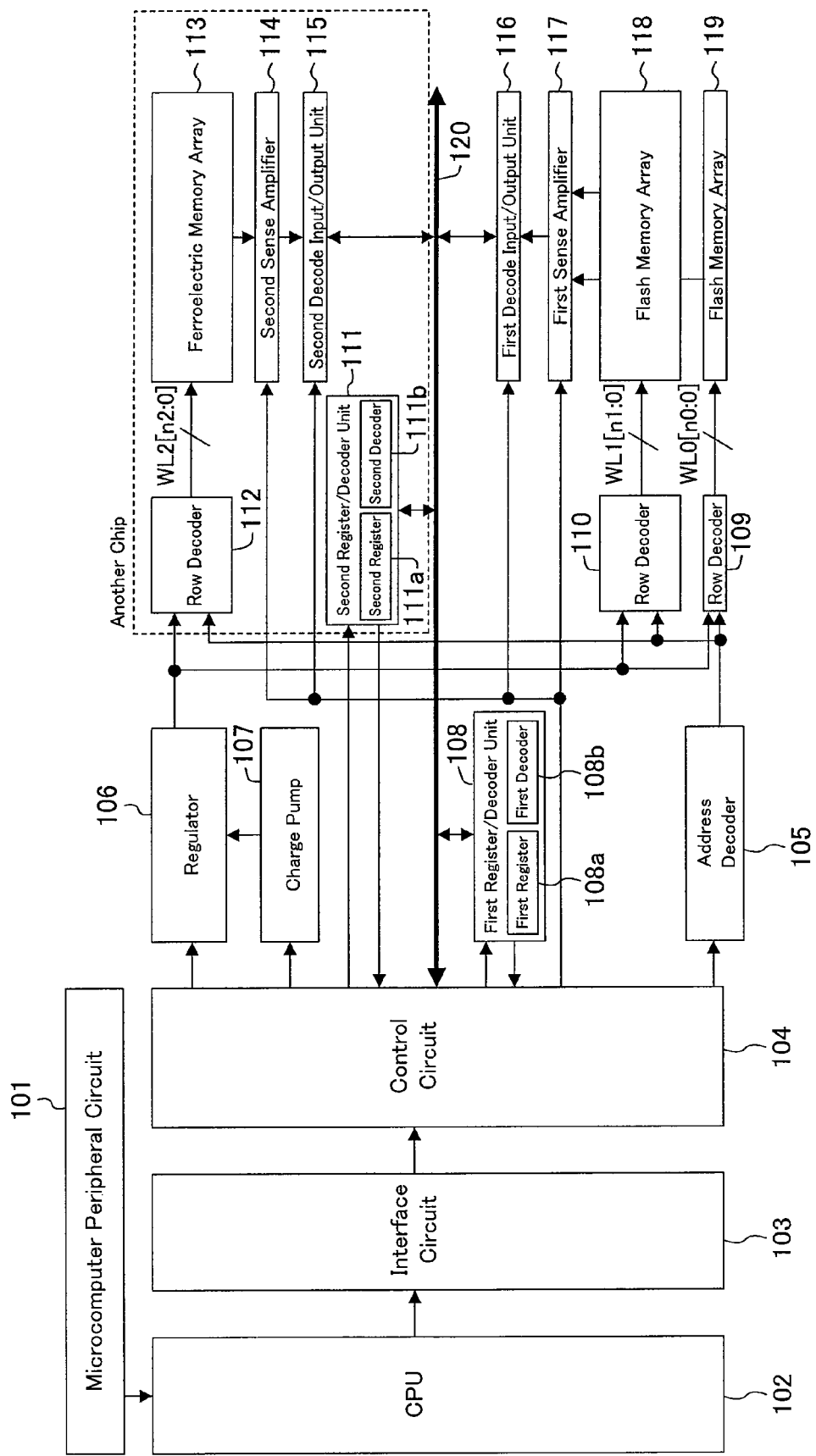
FIG. 2 is a block diagram showing a structure of a variation of Embodiment 1.

FIG. 2 is a block diagram showing a structure of a variation of Embodiment 1. As shown in the drawing, in the present variation, the second register/decoder unit 111, the row decoder 112, the ferroelectric memory array 113, the second sense amplifier 114, and the second decode input/output unit 115 are each constructed on a separate chip.

The arrangement allows the fabrication of a block related to the ferroelectric memory by a process dedicated to the ferroelectric memory, while allowing the fabrication of a block related to the flash memory by a process dedicated to the flash memory. An embedded flash/ferroelectric memory process tends to be costly, but the present variation has the advantage of allowing the implementation of the EEPROM-substituting function without adopting such an embedded process.

Embodiment 2

Figure 3:
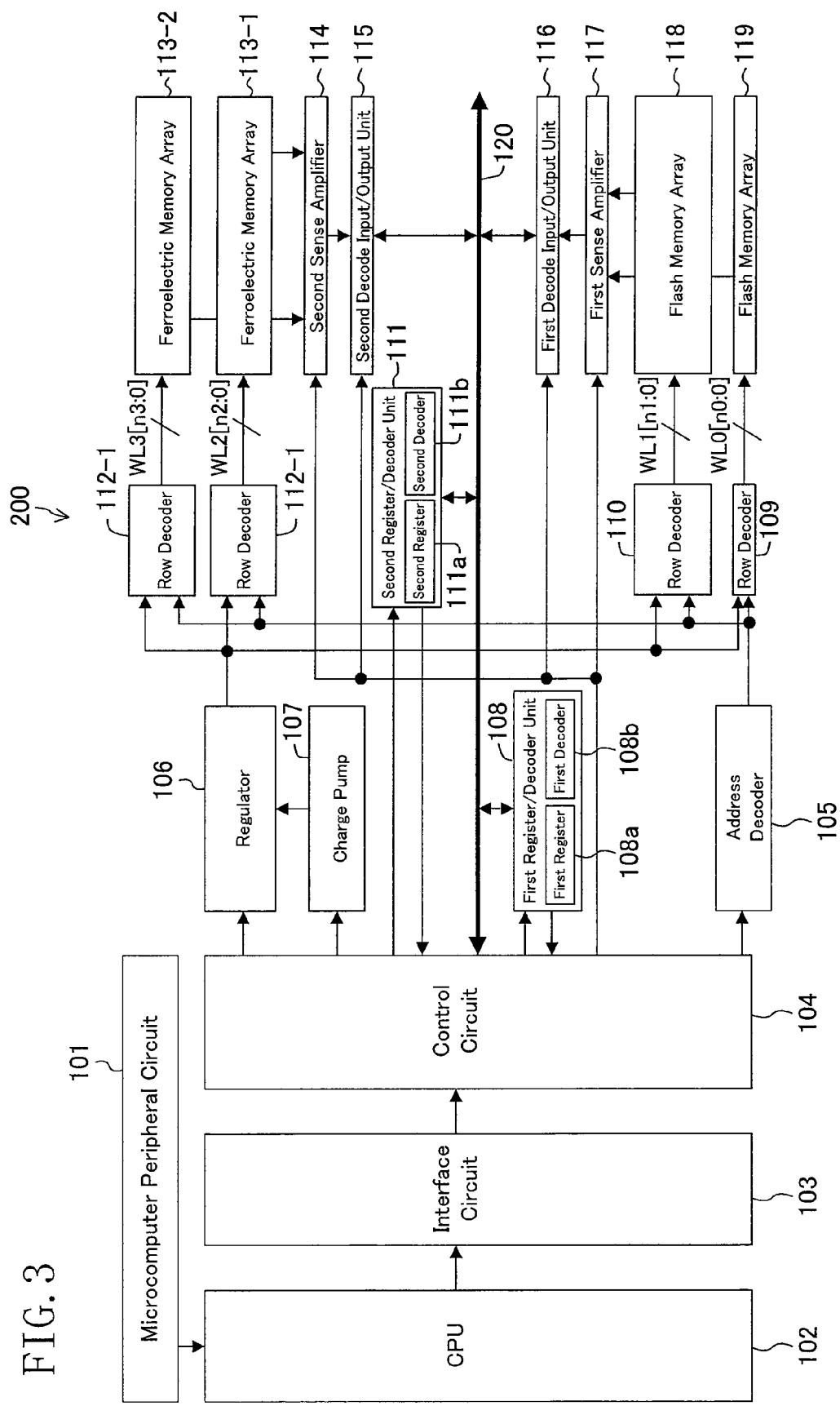
FIG. 3 is a block diagram showing a structure of a semiconductor memory device 200 according to Embodiment 2 of the present invention.

FIG. 3 is a block diagram showing a structure of a semiconductor memory device 200 according to Embodiment 2 of the present invention. The semiconductor memory device 200 is different from the semiconductor memory device 100 according to Embodiment 1 in that it includes a plurality of the ferroelectric memory arrays 113. In the example shown in FIG. 3, the semiconductor memory device 200 includes two ferroelectric memory arrays, and two row decoders are also provided correspondingly. In FIG. 3, these ferroelectric memory arrays and row decoders are designated by reference numerals followed by branch numbers, such as the ferroelectric memory arrays 113-1 and 113-2 and the row decoders 112-1 and 112-2. In the semiconductor memory device 200 also, the individual components thereof are each formed on the same chip.

Since the present embodiment thus constructed has the plurality of ferroelectric memory arrays, it can provide the effect of allowing the operation of storing, in the ferroelectric memory, data which is larger in scale than that stored in each of the semiconductor memory devices according to Embodiment 1 and the variation thereof, in addition to the effect provided by the semiconductor memory device 100 according to Embodiment 1.

Variation of Embodiment 2

Figure 4:
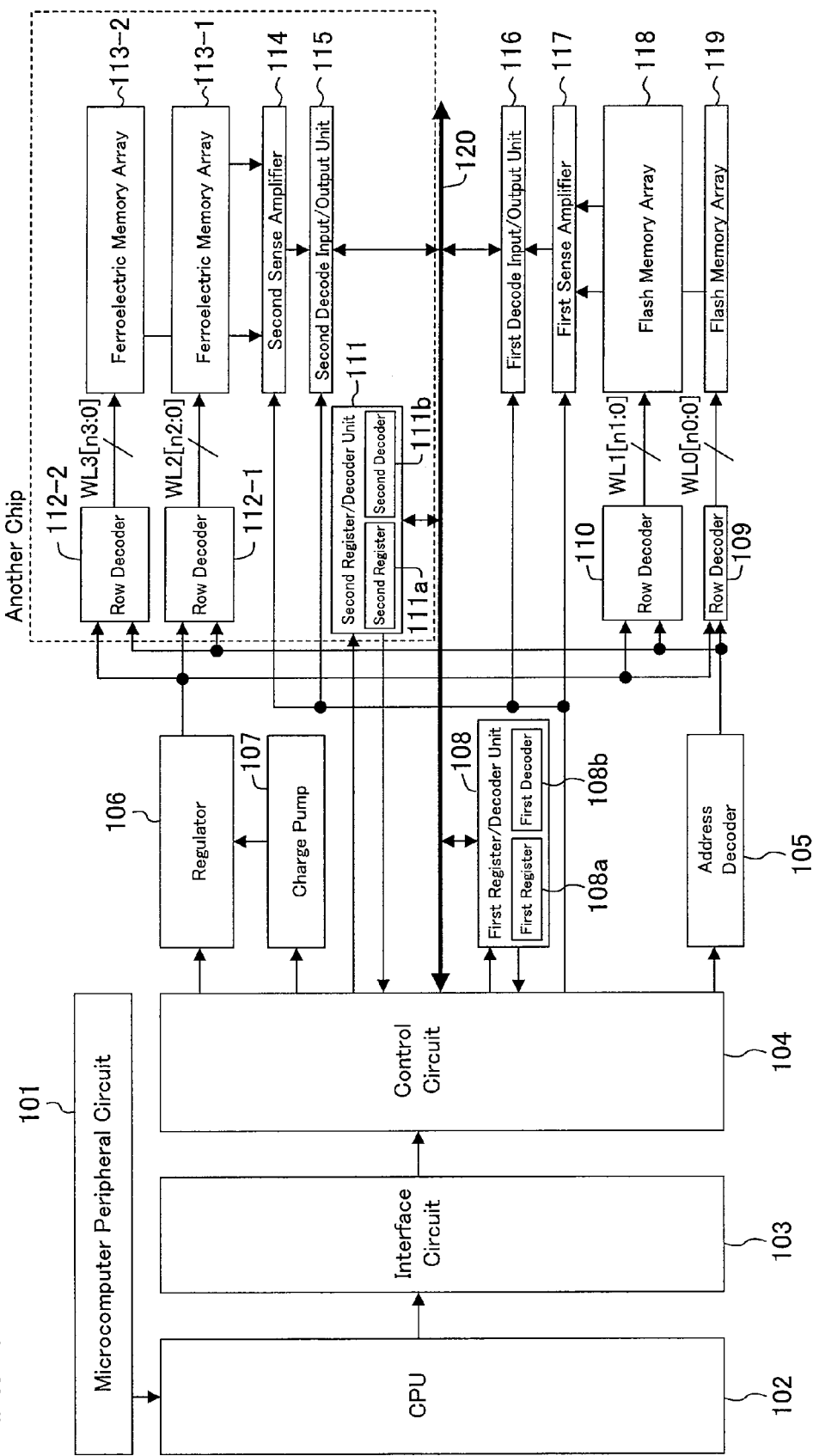
FIG. 4 is a block diagram showing a structure of a variation of Embodiment 2.

FIG. 4 is a block diagram showing a structure of a variation of Embodiment 2. As shown in the drawing, in the present variation, the second register/decoder unit 111, the row decoders 112-1 and 112-2, the ferroelectric memory arrays 113-1 and 113-2, the second sense amplifier 114, and the second decode input/output unit 115 are each formed on a separate chip.

The arrangement allows the fabrication of the block related to the ferroelectric memory by the process dedicated to the ferroelectric memory, while allowing the fabrication of the block related to the flash memory by the process dedicated to the flash memory. An embedded flash/ferroelectric memory process tends to be high in cost, but the present variation has the advantage of allowing the implementation of the EEPROM-substituting function without adopting such an embedded process.

Embodiment 3

Figure 5:
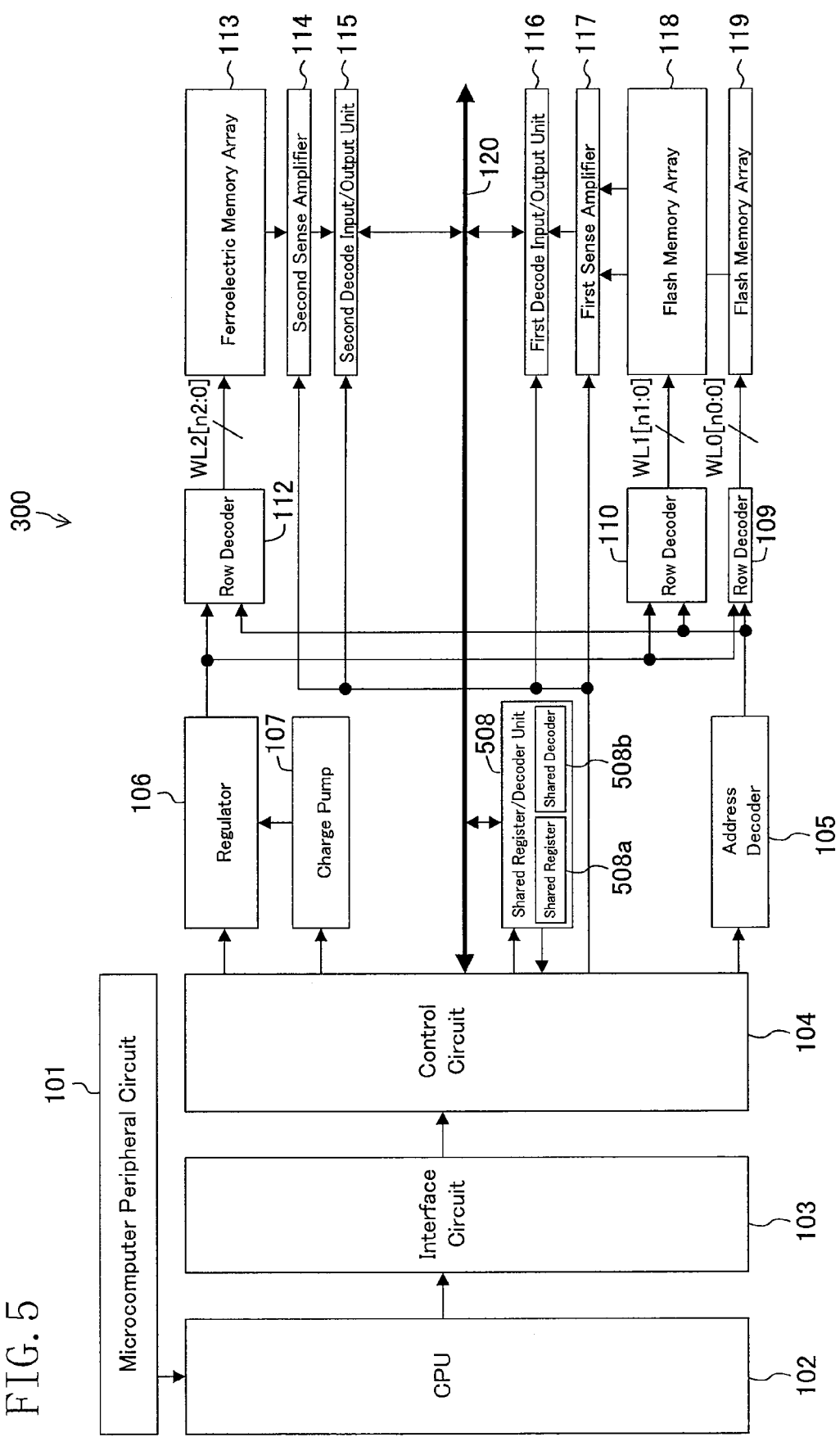
FIG. 5 is a block diagram showing a structure of a semiconductor memory device 300 according to Embodiment 3 of the present invention.

FIG. 5 is a block diagram showing a structure of a semiconductor memory device 300 according to Embodiment 3 of the present invention. The semiconductor memory device 300 is different from the semiconductor memory device 100 according to Embodiment 1 in that the flash memory arrays 118 and 119 and the ferroelectric memory array 113 share one register/decoder unit. In the example shown in FIG. 5, a shared register/decoder unit 508 is connected to the control circuit 104. The shared register/decoder unit 508 is connected to each of the first decode input/output unit 116 and the second decode input/output unit 115 via the data bus 120. In the semiconductor memory device 300 also, the individual components thereof are each constructed on the same chip.

Thus, by sharing the register/decoder unit between the flash memory arrays and the ferroelectric memory array, the chip size can be further reduced compared with that in each of Embodiment 1 and the variation thereof.

Variation of Embodiment 3

Figure 6:
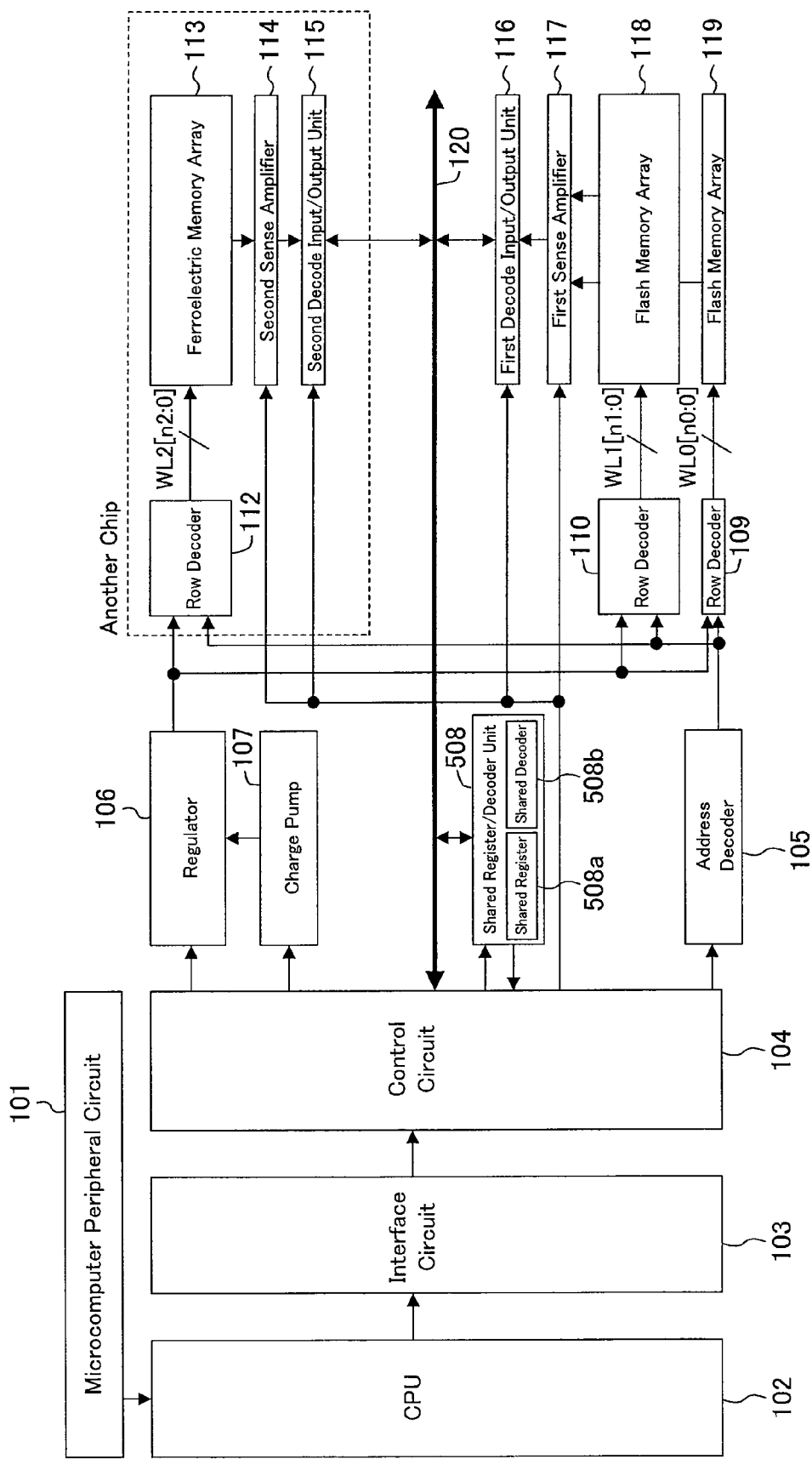
FIG. 6 is a block diagram showing a structure of a variation of Embodiment 3.

FIG. 6 is a block diagram showing a structure of a variation of Embodiment 3. As shown in the drawing, in the present variation, the row decoder 112, the ferroelectric memory array 113, the second sense amplifier 114, and the second decode input/output unit 115 are each constructed on another chip.

The arrangement allows the fabrication of a block related to the ferroelectric memory by a process dedicated to the ferroelectric memory, while allowing the fabrication of a block related to the flash memory by a process dedicated to the flash memory. An embedded flash/ferroelectric memory process tends to be high in cost, but the present variation has the advantage of allowing the implementation of the EEPROM-substituting function without adopting such an embedded process.

Embodiment 4

Figure 7:
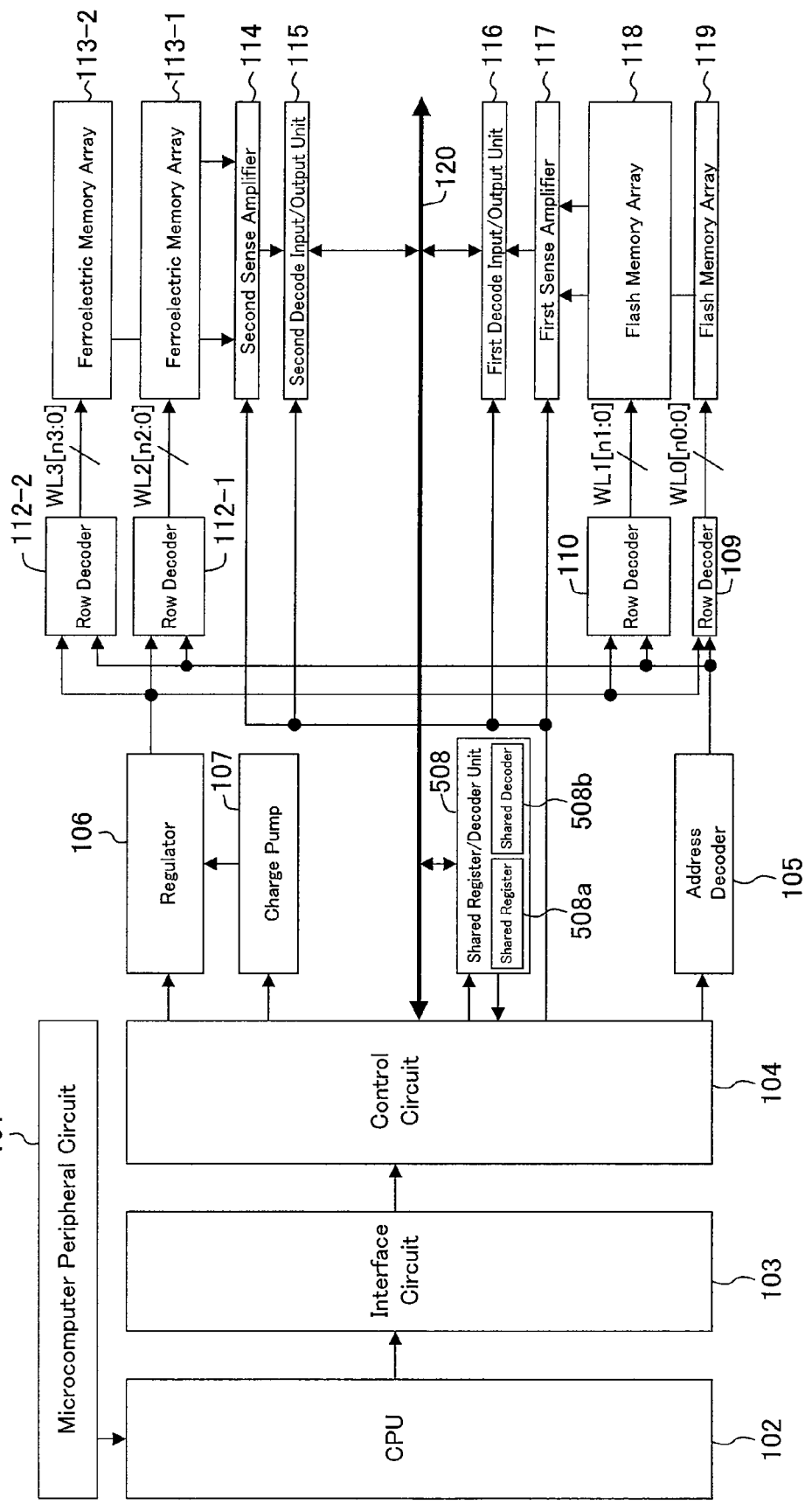
FIG. 7 is a block diagram showing a structure of a semiconductor memory device 400 according to Embodiment 4 of the present invention.

FIG. 7 is a block diagram showing a structure of a semiconductor memory device 400 according to Embodiment 4 of the present invention. The semiconductor memory device 400 is different from the semiconductor memory device 300 according to Embodiment 3 in that it includes a plurality of the ferroelectric memory arrays 113. In the example shown in FIG. 7, the semiconductor memory device 400 includes two ferroelectric memory arrays, and two row decoders are also provided correspondingly. In FIG. 7, these ferroelectric memory arrays and row decoders are designated by reference numerals followed by branch numbers, such as the ferroelectric memory arrays 113-1 and 113-2 and the row decoders 112-1 and 112-2. In the semiconductor memory device 400 also, the individual components thereof are each constructed on the same chip.

Since the present embodiment thus has the plurality of ferroelectric memory arrays, it can provide the effect of allowing the operation of storing, in the ferroelectric memory, data which is larger in scale than that stored in each of the semiconductor memory devices according to Embodiment 3 and the variation thereof, in addition to the effect provided by the semiconductor memory device 300 according to Embodiment 3.

Variation of Embodiment 4

Figure 8:
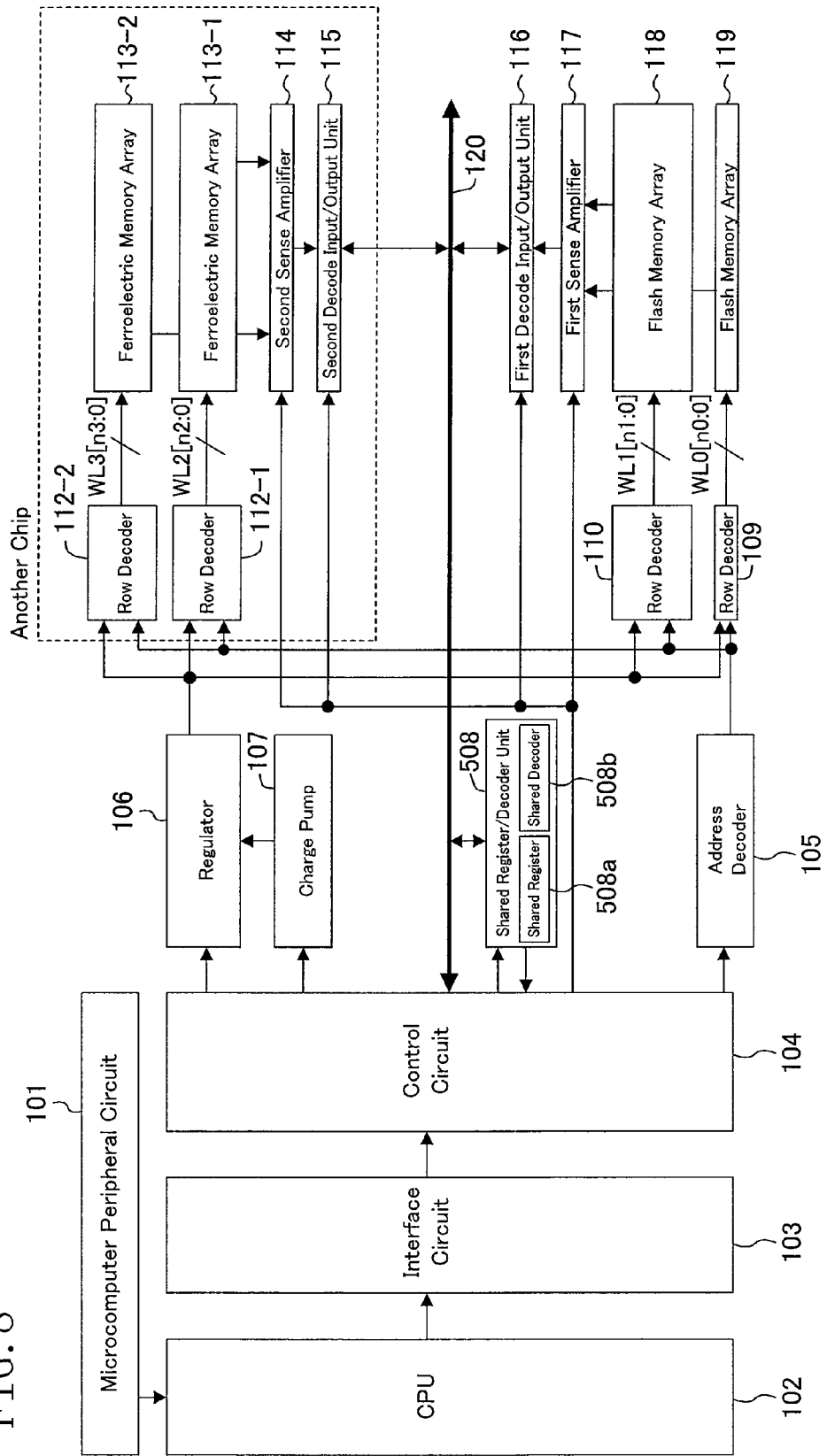
FIG. 8 is a block diagram showing a structure of a variation of Embodiment 4.

FIG. 8 is a block diagram showing a structure of a variation of Embodiment 4. As shown in the drawing, in the present variation, the row decoders 112-1 and 112-2, the ferroelectric memory arrays 113-1 and 113-2, the second sense amplifier 114, and the second decode input/output unit 115 are each constructed on another chip.

The arrangement allows the fabrication of the block related to the ferroelectric memory by the process dedicated to the ferroelectric memory, while allowing the fabrication of the block related to the flash memory by the process dedicated to the flash memory. An embedded flash/ferroelectric memory process tends to be high in cost, but the present variation has the advantage of allowing the implementation of the EEPROM-substituting function without adopting such an embedded process.

Other Embodiments

In each of the embodiments and the variations described above, the flash memory elements are shown by way of example as the plurality of nonvolatile memory elements which require an erase operation before a write operation, but the plurality of nonvolatile memory elements are not limited thereto. In addition, the ferroelectric memory elements are shown by way of example as the plurality of overwritable nonvolatile memory elements, but the plurality of overwritable nonvolatile memory elements are not limited thereto.

What is claimed is:

1. A semiconductor memory device comprising:
   a first nonvolatile memory array including a plurality of nonvolatile memory elements which require an erase operation before a write operation;
   a second nonvolatile memory array including a plurality of overwritable nonvolatile memory elements; and
   a control circuit configured to receive a request to rewrite data, wherein:
   the control circuit is configured to write data to be rewritten to the second nonvolatile memory array from the control circuit when a capacity of the data to be rewritten is equal to or less than a capacity of the second nonvolatile memory array, and
   the control circuit is configured to write data to be rewritten to the first nonvolatile memory array from the control circuit when a capacity of the data to be rewritten is larger than a capacity of the second nonvolatile memory array.

2. The semiconductor memory device of claim 1, wherein the second nonvolatile memory array is formed on a chip different from a chip on which the first nonvolatile memory array and the control circuit are each formed.

3. The semiconductor memory device of claim 1, wherein the second nonvolatile memory array includes a plurality of the second nonvolatile memory arrays.

4. The semiconductor memory device of claim 1, further comprising:
   a shared register which holds data outputted from the first nonvolatile memory array and data outputted from the second nonvolatile memory array; and
   a shared decoder which decodes a command to the first and second nonvolatile memory arrays.

5. The semiconductor memory device of claim 1, wherein the second nonvolatile memory array comprises ferroelectric memory elements as the nonvolatile memory elements.

6. The semiconductor memory device of claim 1, wherein the first nonvolatile memory array comprises flash memory elements as the nonvolatile memory elements.

7. The semiconductor memory device of claim 1, wherein the data to be rewritten are received by the control circuit from an interface circuit.

* * * * *